(12) United States Patent
Ohmori

(10) Patent No.: US 8,856,426 B2
(45) Date of Patent: Oct. 7, 2014

(54) MEMORY DEVICE

(75) Inventor: Mutsuhiro Ohmori, Kanagawa (JP)

(73) Assignee: Sony Corporation, Tokyo (JP)

( * ) Notice: Subject to any disclaimer, the term of this patent is extended or adjusted under 35 U.S.C. 154(b) by 378 days.

(21) Appl. No.: 13/201,699

(22) PCT Filed: Feb. 16, 2010

(86) PCT No.: PCT/JP2010/052269
§ 371 (c)(1),
(2), (4) Date: Aug. 16, 2011

(87) PCT Pub. No.: WO2010/095612
PCT Pub. Date: Aug. 26, 2010

(65) Prior Publication Data
US 2011/0302379 A1 Dec. 8, 2011

(30) Foreign Application Priority Data

Feb. 23, 2009 (JP) ................................. 2009-039037
Feb. 23, 2009 (JP) ................................. 2009-039039
Feb. 23, 2009 (JP) ................................. 2009-039043
Feb. 23, 2009 (JP) ................................. 2009-039054

(51) Int. Cl.
*G06F 12/00* (2006.01)
*G11C 16/22* (2006.01)
*G11C 16/06* (2006.01)

(52) U.S. Cl.
CPC ............... *G11C 16/06* (2013.01); *G11C 16/22* (2013.01)
USPC ............................. 711/103; 711/111; 711/112

(58) Field of Classification Search
None
See application file for complete search history.

(56) References Cited

U.S. PATENT DOCUMENTS

| | | | | |
|---|---|---|---|---|
| 5,812,446 | A | * | 9/1998 | Tailliet .................... 365/185.04 |
| 6,041,007 | A | * | 3/2000 | Roeckner ................... 365/225.7 |
| 2005/0132117 | A1 | * | 6/2005 | Hsieh ............................. 710/313 |
| 2005/0132128 | A1 | * | 6/2005 | Lee ................................ 711/103 |
| 2007/0001279 | A1 | | 1/2007 | Nishizawa et al. |
| 2009/0210645 | A1 | * | 8/2009 | Take et al. ...................... 711/163 |
| 2010/0250802 | A1 | * | 9/2010 | Waugh et al. .................. 710/100 |

FOREIGN PATENT DOCUMENTS

| | | |
|---|---|---|
| CN | 1624644 A | 6/2005 |
| CN | 101038532 A | 9/2007 |
| JP | 03-187169 | 8/1991 |
| JP | 03-035386 | 2/1992 |
| JP | 05-035612 | 2/1993 |
| JP | 08-286976 | 11/1996 |
| JP | 09-016738 | 1/1997 |
| JP | 2004-142783 | 5/2001 |

(Continued)

*Primary Examiner* — Matthew Bradley
*Assistant Examiner* — Daniel Tsui
(74) *Attorney, Agent, or Firm* — Wolf, Greenfield & Sacks, P.C.

(57) ABSTRACT

There is provided a memory device capable of stably storing recorded data over a long term of several decades or longer and capable of reliably reading stored data. A first circuit 200 and a second circuit 300 are separately implementable, and the first circuit 200 includes a data recording circuit 210 reading recorded data from an address appointed by an address signal when a read/write signal stays at a first level and writing data to the address appointed by the address signal when the read/write signal stays at a second level, and a write/read control circuit 230 performing data write/read control on the data recording circuit according to the address signal in response to a read or write instruction from the second circuit.

25 Claims, 10 Drawing Sheets

(56) References Cited

FOREIGN PATENT DOCUMENTS

| JP | 2001-519960 A | 10/2001 |
| JP | 2002-202911 A | 7/2002 |
| JP | 2005-085081 A | 3/2005 |
| JP | 2006-085629 | 3/2006 |
| WO | WO 2006-033157 A1 | 3/2006 |
| WO | WO 2007-010595 A1 | 1/2007 |

* cited by examiner

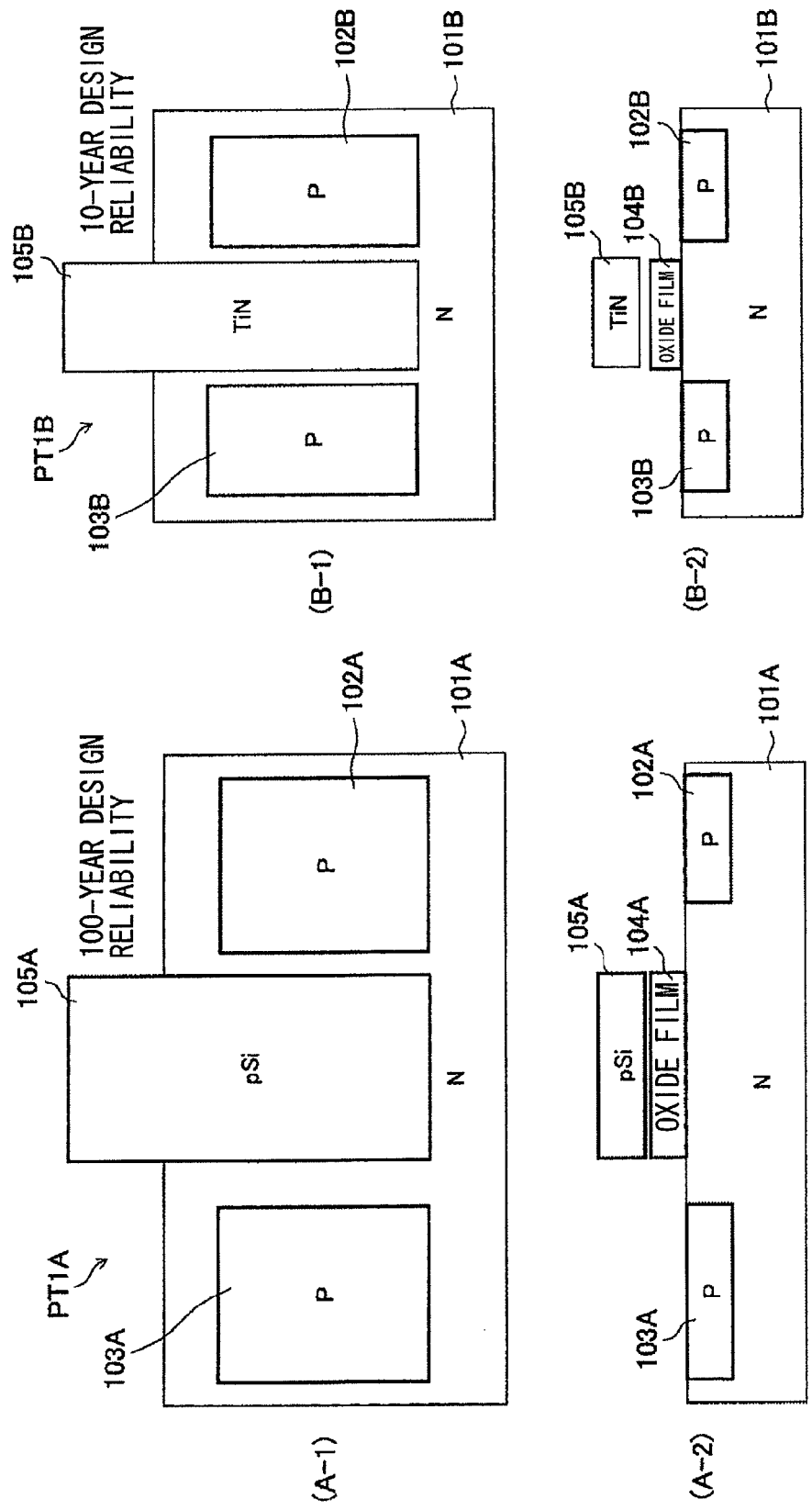

MEMORY DEVICE

The present disclosure contains subject matter related to that disclosed in Japanese Priority Patent Application 2009-039037; Japanese Priority Patent Application 2009-039039; Japanese Priority Patent Application 2009-039043, and Japanese Priority Patent Application 2009-039054; all filed on Feb. 23, 2009, filed the entire content of which is hereby incorporated by reference.

TECHNICAL FIELD

The present invention relates to a long-term storage type memory device capable of storing and reading recorded data over a long term of several decades or longer.

BACKGROUND ART

Recording and storing of digital data in a memory or the like is performed on a daily basis because of the widespread use of digital cameras, computer processing and so on.

At present, information recording media such as memory chips using flash memories which are nonvolatile memories and CDRs are used for information recording and long-term storage.

In memory chips, to avoid accidental writing or the like, there are proposed various techniques for reliably storing information such as inhibiting writing after recording information (for example, refer to PTL 1 and PTL 2).

CITATION LIST

Patent Literature

[PTL 1] Japanese Patent Application Unexamined Publication No. 2001-142783
[PTL 2] Japanese Patent Application Unexamined Publication No. H03-35386

SUMMARY OF THE INVENTION

However, in the case where information recorded in a memory chip, that is, recorded data is stored over a long term of several decades or longer, there are the following disadvantages.

The speed of a long-term storage memory chip seems lower with changing times.

When the long-term storage memory chip has all long-term storage measures, the cost per bit thereof rises.

Interface specifications of the long-term storage memory chip become obsolete quickly.

A long-term storage memory preferably has the minimum number of variations of interface specifications; however, interface specifications of a typical flash memory or the like are changed over time and it is difficult to maintain an interface for multiple generations; therefore, it will become virtually impossible to read data.

As an LSI for control is built in a memory card with a memory, cost per bit is increased by cost except for the cost of the memory.

Moreover, there is a high possibility that recorded data is changed by a virus attack, a human error or the like.

Further, in an NAND flash, weak writing is performed during a read operation to thereby cause deterioration in data retention characteristics.

Therefore, it is desirable to provide a memory device capable of stably storing recorded data over a long term of several decades or longer and capable of reliably reading stored data.

A first memory device of the invention includes: a first circuit provided to perform data recording for storing; and a second circuit allowed to perform data transfer control to allow the first circuit to perform data recording and data reproduction, in which the first circuit and the second circuit are separately implementable, and the first circuit includes: a data recording circuit reading recorded data from an address appointed by an address signal when a read/write signal stays at a first level, whereas writing data to the address appointed by the address signal when the read/write signal stays at a second level; and a write/read control circuit performing data write/read control on the data recording circuit according to the address signal in response to a read or write instruction from the second circuit.

A second memory device of the invention includes: a first circuit provided to perform data recording for storing; and a second circuit allowed to perform data transfer control to allow the first circuit to perform data recording and data reproduction, in which the first circuit and the second circuit are separately implementable, and the first circuit includes: a data recording circuit reading recorded data from an address appointed by an address signal when a read/write signal stays at a first level, whereas writing data to the address appointed by the address signal when the read/write signal stays at a second level; and a write/read control circuit performing data write/read control on the data recording circuit according to the address signal in response to a read or write instruction from the second circuit, and performing control to set the read/write signal to the data recording circuit to the first level in response to the occurrence of a predetermined event, thereby inhibiting the data recording circuit from data-writing.

A third memory device of the invention includes: a first circuit provided to perform data recording for storing; and a second circuit allowed to perform data transfer control to allow the first circuit to perform data recording and data reproduction, in which the first circuit and the second circuit are separately implementable, the first circuit includes: a data recording circuit reading recorded data from an address appointed by an address signal when a read/write signal stays at a first level, whereas writing data to the address appointed by the address signal when the read/write signal stays at a second level; and a write/read control circuit performing data write/read control on the data recording circuit according to the address signal in response to a read or write instruction from the second circuit, and the second circuit includes: a data transfer control circuit performing data transfer control between the first and second circuits; and a work memory for the data transfer control circuit, and the data transfer control circuit temporarily stores data, which is to be written to the data recording circuit in the first circuit, into the work memory, and sequentially transfers the stored data from the work memory to the write/read control circuit in the first circuit.

A fourth memory device of the invention includes: a first circuit provided to perform data recording for storing; and a second circuit allowed to perform data transfer control to allow the first circuit to perform data recording and data reproduction, in which the first circuit includes: a data recording circuit reading recorded data from an address appointed by an address signal when a read/write signal stays at a first level, whereas writing data to the address appointed by the address signal when the read/write signal stays at a second level; a write/read control circuit performing data write/read control on the data recording circuit according to the address signal in response to a read or write instruction from the second circuit, and performing control to set the read/write signal to the data recording circuit to the first level in response to the occurrence of a predetermined event, thereby inhibiting the data recording circuit from data-writing; a long-reliability read control circuit transferring read data from the data recording circuit to the second circuit, when the data recording circuit is inhibited from data-writing; and a selector selecting a first path when the data recording circuit is not inhibited from data-writing, and selecting a second path when the data recording circuit is inhibited from data-writing, the first path allowing data writing to or data reading from the data recording circuit through the write/read control circuit, the second path allowing data reading from the data recording circuit through the long-reliability read control circuit.

According to the invention, recorded data is allowed to be stably stored over a long term of several decades or longer, and stored data is allowed to be reliably read.

BRIEF DESCRIPTION OF THE DRAWINGS

FIG. 6 is a diagram conceptually illustrating an example of designing circuits according to a plurality of service lives in one and the same chip designed based on a plurality of design criteria.

DESCRIPTION OF EMBODIMENTS

Figure 1:
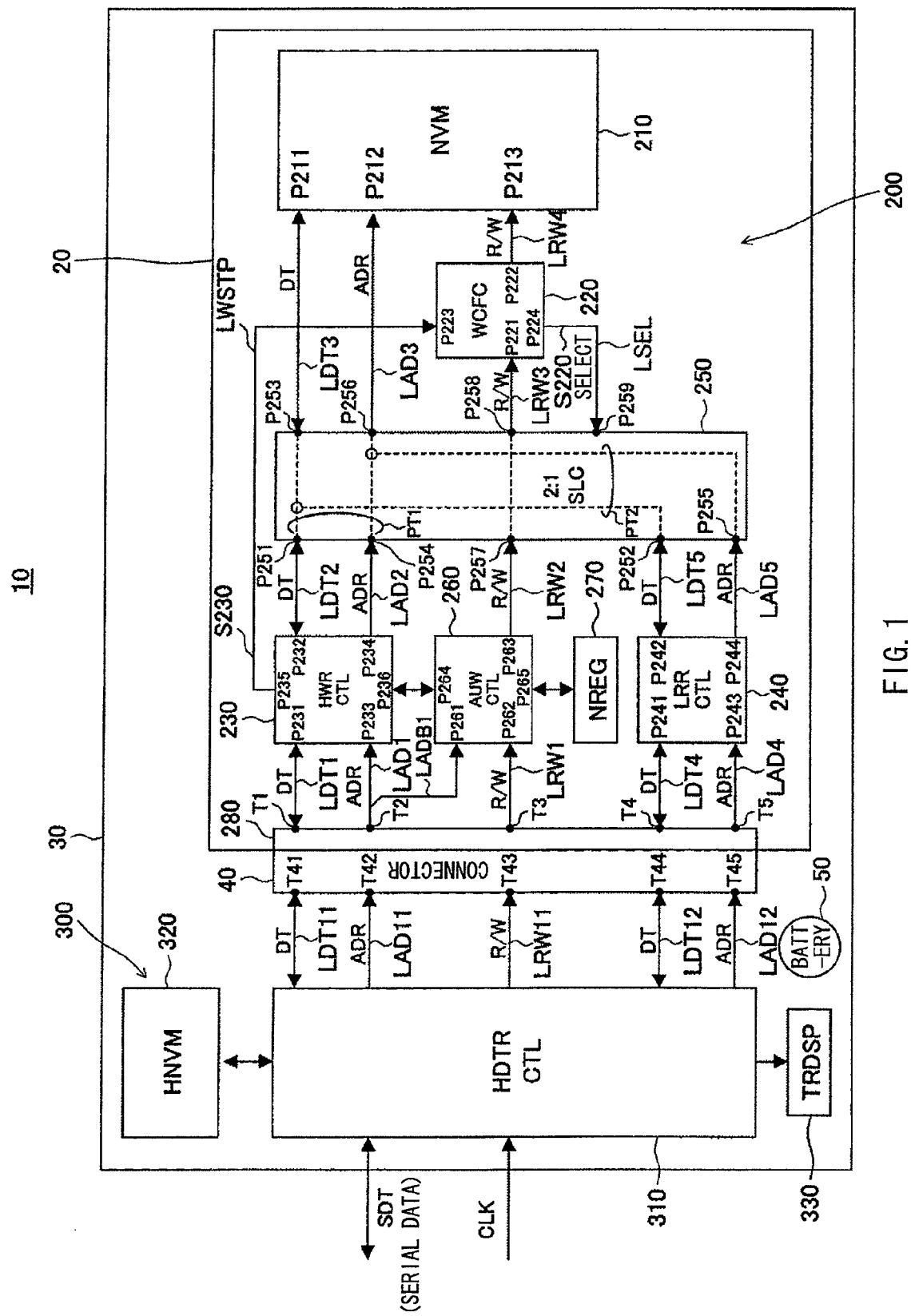
FIG. 1 is a block diagram illustrating a configuration example of a memory device using a long-term storage memory according to an embodiment of the invention.

An embodiment of the present invention will be described below referring to the accompanying drawings.

It is to be noted that descriptions will be given in the following order.
1. Whole configuration of memory device
2. Fuse control
3. Control by write pointer
4. Process of continuing transfer
5. Design based on a plurality of design criteria
6. Recording of chip identification data
7. Serial communication format
8. Breakdown avoidance by a plurality of modules
9. Analysis with mark figure <1. Whole Configuration of Memory Device>

FIG. 1 is a block diagram illustrating a configuration example of a memory device using a long-term storage memory according to an embodiment of the invention.

As illustrated in FIG. 1, a memory device 10 includes a first circuit board 20, a second circuit board 30 forming, for example, a memory card, and a connector 40 removably connectable to the first circuit board 20.

A first circuit 200 for recording data and storing recorded data over a long term of several decades to a hundred years is implemented in the first circuit board 20.

A second circuit 300 capable of controlling transfer of data for recording and reproduction in the first circuit 200 and the connector 40 are implemented in the second circuit board 30.

Moreover, a battery 50 is implementable in the second circuit board 30.

The first circuit board 20 is removably connected to the connector 40.

In other words, in the embodiment, the first circuit 200 and the second circuit 300 are formed to be separately implementable.

In FIG. 1, DT, ADR, STD and R/W indicate data, address, serial data and read signal or write signal, respectively.

[Components of First Circuit 200]

The first circuit 200 includes a nonvolatile memory (NVM) 210 as a data recording circuit, an entire-write control fuse circuit (WCFC) 220, a high-speed write/read control circuit (HWRCTL) 230, and a long-reliability read control circuit (LRRCTL) 240.

The first circuit 200 includes a 2:1 selector (SLC; hereinafter simply referred to as selector) 250, an area-unit write control circuit (AUWCTL) 260, a nonvolatile register (NREG) 270, and a connection section 280 removably connectable to the connector 40.

The first circuit 200 includes address lines LAD1, LAD2, LAD3, LAD4 and LAD5 indicating a write/read address.

The first circuit 200 includes data lines LDT1, LDT2, LDT3, LDT4 and LDT5 transmitting write/read data.

The first circuit 200 includes read/write lines (R/W lines) LRW1, LRW2, LRW3 and LRW4 set to a first level during reading and set to a second level during writing through the second circuit 300.

[Components of Second Circuit 300]

The second circuit 300 includes a high-speed data transfer control circuit (HDTRCTL) 310, a high-speed nonvolatile memory (HNVM) 320 and a transfer display section (TRDSP) 330.

The second circuit 300 includes address lines LAD11 and LAD12 indicating a write/read address.

The second circuit 300 includes data lines LDT11 and LDT12 transmitting write/read data.

The second circuit 300 includes an R/W line (read/write line) LRW11 set to a first level during reading and set to a second level during writing by a higher-level device (not illustrated).

In the second circuit 300, the address lines LAD11 and LAD12, the data lines LDT11 and LDT12 and the R/W line LRW11 are installed between input/output ports on one side of the high-speed data transfer control circuit 310 and predetermined terminals of the connector 40.

In the embodiment, the first level to which the R/W lines LRW1 to LRW4 are set during reading is a high level (H), and the second level to which the W/R lines LRW1 to LRW4 are set during writing is a low level (L).

The nonvolatile memory 210 includes a data input/output port P211, an address input port P212 and an R/W signal input port P213.

The entire-write control fuse circuit 220 includes an R/W signal input port P221, an R/S signal output port P222, a write inhibition signal input port P223 and a selection signal output port P224.

The high-speed write/read control circuit 230 includes a first data input/output port P231, a second data input/output port P232, an address input port P233, an address output port P234 and a write inhibition signal output port P235. Moreover, the high-speed write/read control circuit 230 includes an input/output port P236 for control signal connected to the area-unit write control circuit 260.

The long-reliability read control circuit 240 includes a first data input/output port P241, a second data input/output port P242, an address input port P243 and an address output port P244.

The selector 250 includes a first data input/output port P251, a second data input/output port P252, a third data input/output port P253, a first address input port P254, a second address input port P255 and an address output port P256. The selector 250 includes an R/W signal input port P257, an R/W signal output port P258 and a selection signal input port P259.

The area-unit write control circuit 260 includes an address input port P261, an R/W signal input port P262 and an R/W signal output port P263.

The area-unit write control circuit 260 includes an input/output port P264 for control signal connected to the high-speed write/read control circuit 230. Moreover, the area-unit write control circuit 260 includes an input/output port P265 for data connected to the nonvolatile register 270.

The connection section 280 is formed by including input/output terminals T1 to T5.

[Wiring Connection of First Circuit 200]

Each wiring line in the first circuit 200 is connected in the following manner.

The data input port P211 of the nonvolatile memory 210 and the third data input/output port P253 of the selector 250 are connected to each other through the data line LDT3.

The address input port P212 of the nonvolatile memory 210 and the address output port P256 of the selector 250 are connected to each other through the address line LAD3.

The R/W signal input port P213 of the nonvolatile memory 210 and the R/W signal output port P222 of the entire-write control fuse circuit 220 are connected to each other through the R/W line LRW4.

The R/W signal input port P221 of the entire-write control fuse circuit 220 is connected to the R/W signal output port P258 of the selector 250.

The write inhibition signal input port P223 of the entire-write control fuse circuit 220 and the write inhibition signal output port P235 of the high-speed write/read control circuit 230 are connected to each other through a write inhibition signal line LWSTP.

The selection signal output port P224 of the entire-write control fuse circuit 220 and the selection signal input port P259 of the selector 250 are connected to each other through a selection signal line LSEL.

The first data input/output port P231 on a second circuit side of the high-speed write/read control circuit 230 and a corresponding terminal T1 of the connection section 280 are connected to each other through the data line LDT1.

The address input port P233 of the high-speed write/read control circuit 230 and a corresponding terminal T2 of the connection section 280 are connected to each other through the address line LAD1.

The address input port P261 of the area-unit write control circuit 260 and the terminal T2 of the connection section 280 are connected to each other through the address line LAD1 and a branch line LADB1 thereof.

The R/W signal input port P262 of the area-unit write control circuit 260 and the terminal T3 of the connection section 280 are connected to each other through the R/W line LRW1.

The data input/output port P241 on the second circuit side of the long-reliability read control circuit 240 and a corresponding terminal T4 of the connection section 280 are connected to each other through the data line LDT4.

The address input port P243 of the long-reliability read control circuit 240 and a corresponding terminal T5 of the connection section 280 are connected to each other through the address line LAD4.

When the connection section 280 of the first circuit 200 is connected to the connector 40, the data line LDT1 is connected to the data line LDT11 of the second circuit 300 through the terminal T1 of the connection section 280 and a terminal T41 of the connector 40.

When the connection section 280 of the first circuit 200 is connected to the connector 40, the address line LAD1 is connected to the address line LAD11 of the second circuit 300 through the terminal T2 of the connection section 280 and a terminal T42 of the connector 40.

When the connection section 280 of the first circuit 200 is connected to the connector 40, the R/W line LRW1 is connected to the R/W line LRW11 of the second circuit 300 through the terminal T3 of the connection section 280 and a terminal T43 of the connector 40.

When the connection section 280 of the first circuit 200 is connected to the connector 40, the data line LDT4 is connected to the data line LDT12 of the second circuit 300 through the terminal T4 of the connection section 280 and a terminal T44 of the connector 40.

When the connection section 280 of the first circuit 200 is connected to the connector 40, the address line LAD4 is connected to the address line LAD12 of the second circuit 300 through the terminal T5 of the connection section 280 and a terminal T45 of the connector 40.

The second data input/output port P232 of the high-speed write/read control circuit 230 and the first data input/output port P251 of the selector 250 are connected to each other through the data line LDT2.

The address output port P234 of the high-speed write/read control circuit 230 and the first address input port P254 of the selector 250 are connected to each other through the address line LAD2.

The R/W signal output port P263 of the area-unit write control circuit 260 and the R/W signal input port P257 of the selector 250 are connected to each other through the R/W line LRW2.

The data input/output port P242 of the long-reliability read control circuit 240 and the second data input/output port P252 of the selector 250 are connected to each other through the data line LDT5.

The address output port P244 of the long-reliability read control circuit 240 and the second address input port P255 of the selector 250 are connected to each other through the address line LAD5.

The first circuit 200 with the above configuration is allowed to be connected to the second circuit 300 by connecting the connection section 280 to the connector 40 and mounting the connection section 280 on the connector 40.

The first circuit 200 is allowed to be separated from the second circuit 300 by releasing the connection state of the connection section 280 to the connector 40, and is allowed to be connected to the second circuit 300 by connecting the connection section 280 of another first circuit 200 to the connector 40.

The memory device 10 of the embodiment is allowed to replace the first circuit 200 for recording data and storing the data over a long term with another one.

Then, the memory device 10 of the embodiment is formed to allow each component in the first circuit 200 and the second circuit 300 to basically have the following functions. Recorded data is allowed to be reliably stored over a long term by having the following functions:
1) a write control function (write mask function) for prevention of a virus attack, a human error or the like;
2) a function of caching and continuing transfer for speed conversion and prevention of deterioration in a long-term storage memory;
3) an ability to implement design circuits with different reliability criteria; and
4) writing of chip identification data.

Specific configurations and functions of the components of the first circuit 200 and the second circuit 300 in the memory device 10 having the above-described various functions will be described in detail below.

[Functions of Respective Components of First Circuit]

First, functions of respective components of the first circuit 200 will be described below.

The nonvolatile memory 210 is formed of, for example, a flash memory. The types of flash memory include an NOR type and an NAND type, and in the case of the NAND type flash memory, weak writing may be performed during a read operation.

Therefore, in the embodiment, the nonvolatile memory 210 is formed of the NOR type flash memory to function as a long-term storage memory.

The nonvolatile memory 210 reads recorded data from an address ADR appointed by the address line LAD3 when the R/W line LRW4 stays at the first level (at the high level in the embodiment) to transmit the recorded data to the data line LDT3.

The nonvolatile memory 210 writes data DT transferred from the data line LDT3 to the address ADR appointed by the address line LAD3 when the R/W line LRW4 stays at the low level which is the second level.

To allow the nonvolatile memory 210 to function as a long-term storage memory, as will be described later, a gate electrode or wiring is formed of not a metal but a corrosion-resistance material, for example, polysilicon.

Also in the selector 250, the long-reliability read circuit 240, the entire-write control fuse circuit 220 forming a long-term storage circuit with the nonvolatile memory 210, a gate electrode or wiring of a transistor is formed of a corrosion-resistance material, for example, polysilicon.

Likewise, the data lines LDT3 to LDT5, the address lines LAD3 to LAD5, the R/W lines LRW3 and LRW4 and the like are formed of a corrosion-resistance material, for example, polysilicon.

In the case where the write inhibition signal 5230 is, for example, at the low level which is inactive, the entire-write control fuse circuit 220 supplies the R/W line LRW3 at a supplied high level or low level to the nonvolatile memory 210 through the R/W line LRW4.

In the case where write inhibition signal 5230 is, for example, at the high level which is active, the entire-write control fuse circuit 220 fixes the level of the R/W line LRW4 to the high level (the first level) to inhibit data writing to the nonvolatile memory 210.

The entire-write control fuse circuit 220 includes a fuse circuit and performs control of blowout (burning out) of a fuse in response to the write inhibition signal S230 of the high-speed write/read control circuit 230.

The fuse circuit and the control thereof will be described in detail later.

In the case where the level of the R/W line LRW4 is fixed to the high level (the first level) (for example, in the case where a fuse is burnt out), the entire-write control fuse circuit 220 allows the selection signal 5220 to be active and outputs the selection signal 5220 to the selector 250.

Moreover, in the case where the R/W lines LRW2 and LRW3 are set to the high level by the area-unit write control circuit 260 to inhibit writing, the entire-write control fuse circuit 220 sets the R/W line LRW4 to the high level.

The high-speed write/read control circuit 230 performs data write/read control on the nonvolatile memory 210 through the address line LAD1 and the data line LDT1 in response to a read or write instruction from the second circuit 300.

The high-speed write/read control circuit 230 receives a read or write instruction from the second circuit 300 through the area-unit write control circuit 260 in the configuration in FIG. 1.

In the case where a write mask process of the nonvolatile memory 210 is performed in response to the occurrence of a predetermined event, the high-speed write/read control circuit 230 supplies the write inhibition signal 5230 which is active to the entire-write control fuse circuit 220.

The occurrence of the predetermined event indicates, for example, a case where writing is performed from a start address, and this address reaches a predetermined address, a case where a memory removal instruction is provided, or the like.

Moreover, the occurrence of the event includes a case where the occurrence of the event is informed by the area-unit write control circuit 260 in response to control by a write pointer.

In this case, a write address may start from any address, or the write address may count up or down, or an arbitrary address may be provided.

In the case where data is stored under a count-up mode, the area-unit write control circuit 260 inhibits writing to a lower-order address than a written address.

The high-speed write/read control circuit 230 is allowed to access the nonvolatile register 270 through the area-unit write control circuit 260.

Therefore, the high-speed write/read control circuit 230 is allowed to perform writing and reading by the address ADR, the data DT from the high-speed data transfer control circuit 310 of the second circuit 300 and an R/W signal from the area-unit write control circuit 260.

The long-reliability read control circuit 240 receives, through the selector 250, read data from the nonvolatile memory 210 where writing is inhibited by an R/W line fixed to the high level of the entire-write control fuse circuit 20, and transfers the read data to the second circuit 300.

The long-reliability read control circuit 240 performs data reading with use of the data lines LDT4 and LDT5 and the address lines LAD4 and LAD5 which are different from the data lines LDT1 and LDT2 and the address lines LAD1 and LAD2 of the high-speed write/read control circuit 230.

In the case where the selection signal S220 by the entire-write control fuse circuit 220 is inactive, the selector 250 selects a first path PT1 allowing data writing/reading on the nonvolatile memory 210 through the high-speed write/read control circuit 230.

In the case where the selection signal S220 by the entire-write control fuse circuit 220 is active, the selector 250 selects a second path PT2 allowing data reading from the nonvolatile memory 210 through the long-reliability read control circuit 240.

In the embodiment, the selector 250 selects the first path PT1 in the case where the selection signal S220 stays at the high level (inactive) and selects the second path PT2 in the case where the selection signal S220 stays at the low level (active).

For example, in case where data is stored under a count-up mode or a count-down mode, in the area-unit write control circuit 260, the occurrence of an event indicates a case where the address reaches a lower-order or higher-order address than a written address.

Then, when the address reaches the lower-order or higher-order address than the written address, the area-unit write control circuit 260 provides an instruction to, for example, the high-speed write/read control circuit 230 to inhibit writing.

The area-unit write control circuit 260 controls an R/W signal emitted from the area-unit write control circuit 260 in response to the address ADR supplied from the second circuit 300 side not to be written, that is, not to be changed to the low level.

In other words, the area-unit write control circuit 260 controls the R/W line LRW2, which allows the R/W signal emitted from the area-unit write control circuit 260 in response to the supplied address ADR to propagate therethrough, not to be changed to a write state, that is, the low level.

The nonvolatile register 270 is allowed to be accessed by the high-speed write/read control circuit 230 through the area-unit write control circuit 260.

The nonvolatile register 270 stores, for example, an address and data from the high-speed data transfer control circuit 310 of the second circuit 300 by the area-unit write control circuit 260.

The long-reliability read control circuit 240 and a signal path relating to the long-reliability read control circuit 240 of the selector 250 in the first circuit 200 are designed to have a margin for performance deterioration in a semiconductor or the like in expectation of characteristics for long-term use such as 100-year use.

The high-speed write/read control circuit 230 and a remaining circuit of the selector 250 are designed to have a design margin under a 10-year warranty on characteristics in typical design of a semiconductor or the like.

Moreover, wiring of the long-reliability read control circuit 240 and the signal path relating to the long-reliability read control circuit 240 of the selector 250 in the first circuit 200 is carried out in the following manner.

Namely, for corrosion resistance, instead of metal wiring, wiring is carried out with use of polysilicon, and a high-speed circuit is designed for a remaining part by using metal wiring.

A specific formation example will be described later.

[Functions of Respective Components of Second Circuit]

Next, functions of respective components of the second circuit 300 will be described below.

To perform write/read control on the nonvolatile memory 210 of the first circuit 200, the high-speed data transfer control circuit 310 is connected to a high-speed nonvolatile memory 320 as a work memory thereof. The high-speed nonvolatile memory 320 functions as, for example, a cache memory.

The high-speed data transfer control circuit 310 temporarily stores data, which is to be written to the nonvolatile memory and is supplied from a serial port, into the high-speed nonvolatile memory 320, and sequentially transfers the data to the first circuit 200 side.

In the case where data of a corresponding address is present in the high-speed nonvolatile memory 320 during reading data in the nonvolatile memory 210 of the first circuit 200, the high-speed data transfer control circuit 310 transfers data in the high-speed nonvolatile memory 320 from the serial data port to a connected device.

Thus, the high-speed data transfer control circuit 310 has a sequential data transfer process function.

Even if the second circuit 300 is taken out of the connected device, the built-in battery 50 supplies electric power.

Therefore, the high-speed data transfer control circuit 310 continuously transfers write data, stored in the high-speed nonvolatile memory 320, to the nonvolatile memory 210 of the first circuit 200 from the high-speed nonvolatile memory 320 to the first circuit 200 side.

The high-speed data transfer control circuit 310 completes transfer when no data, stored in the high-speed nonvolatile memory 320, to be written to the nonvolatile memory 210 of the first circuit 200 is present in the high-speed nonvolatile memory 320.

In the case where data to be written to the nonvolatile memory 210 of the first circuit 200 is present in the high-speed nonvolatile memory 320, the high-speed data transfer control circuit 310 informs a user that data is being transferred by a current flowing to a transfer display section 330 such as an LED as a transfer display.

The transfer display section 330 is an example of an informing section.

Next, a characteristic implementation configuration of the memory device 10 with the above-described configuration and basic operation thereof will be described below.

After that, fuse control, control by a write pointer, a process of continuing transfer, a plurality of design criteria, a process of recording chip identification data, a serial communication format, a configuration for breakdown avoidance by a plurality of modules and analysis with a mark figure will be described in order referring to drawings.

The memory device 10 formed as a memory chip or an electronic circuit board is configured to allow the first circuit 200 for recording data over a long term and the second circuit 300 capable of recording and reproducing data appropriately with the times to be separately implemented.

Then, in the memory device 10, the first circuit 200 is allowed to be removed from the second circuit 300, and to be replaced with another first circuit 200.

In the first circuit 200, the nonvolatile memory 210 as a data recording circuit for recording data of a user is provided.

Signal lines of the nonvolatile memory of the first circuit 200 include a data line LDT transmitting write and read data, an address line LAD indicating write and read addresses, an R/W line LRW which is a high-level signal during reading and a low-level signal during writing.

The R/W lines LRW3 and LRW4 are connected to the entire-write control fuse circuit 220, and when the entire-write control fuse circuit blows a fuse, the R/W line LRW4 to the nonvolatile memory 210 of the first circuit 200 is fixed to the high level.

Another signal lines of the nonvolatile memory 210 of the first circuit 200, that is, the data line LDT3 and the address line LAD3 are connected to the selector 250 to be connected to one of the high-speed write/read control circuit 230 and the long-reliability read control circuit 240.

The selection signal S220 of the selector 250 is determined by the entire-write control fuse circuit 220 to be fixed to the high level before blowing the fuse, and to be fixed to the low level by pull-down when the fuse is blown.

In the case where the selection signal 5220 stays at the high level, the data DT and the address ADR on the high-speed write/read control circuit 230 side are selected.

In the case where the selection signal 5220 stays at the low level, the data DT and the address ADR on the long-reliability read control circuit 240 side are selected.

The high-speed write/read control circuit 230 accesses the nonvolatile register 270 through the area-unit write control circuit 260.

Writing and reading are allowed by the address ADR and the data DT from the high-speed data transfer control circuit 310 of the second circuit 300 and the R/W signal from the area-unit write control circuit 260.

In the nonvolatile register 270, a write address to the nonvolatile memory 210 of the first circuit 200 is mainly stored; however, in some cases, individual identification data to the nonvolatile memory 210 of the first circuit 200 is stored.

The high-speed write/read control circuit 230 and the long-reliability read control circuit 240 are connected to the second circuit 300 through the connector 40.

In the first circuit 200, the R/W signal emitted from the area-unit write control circuit 260 is controlled to be written according to the address ADR supplied to the first circuit 200, that is, not to be changed to the low level.

Write control on the area-unit write control circuit 260 is performed in the following manner.

In the high-speed data transfer control circuit 310 of the second circuit 300, the write address ADR to the nonvolatile memory 210 of the first circuit 200 is transferred to the area-unit write control circuit 260.

Then, the write address is stored as a write minimum address in the nonvolatile register 270 by the area-unit write control circuit 260 in response to a rising edge of the R/W signal.

The area-unit write control circuit 260 controls writing to an address which has been written to be inhibited by preventing the R/W signal from being changed to the low level by a smaller address than the write minimum address stored in a subsequent access.

In the high-speed data transfer control circuit 310 of the second circuit 300, to perform write/read control on the nonvolatile memory 210 of the first circuit 200, the high-speed nonvolatile memory 320 as a work memory thereof is used.

In the high-speed data transfer control circuit 310, data, which is to be written to the nonvolatile memory 210 and is supplied from the serial data port, is temporarily stored in the high-speed nonvolatile memory 320. Then, the data is sequentially transferred to the first circuit 200 side to perform data writing to the nonvolatile memory 210.

Moreover, when the data of the nonvolatile memory 210 of the first circuit 200 is read, the following process is performed in the case where data of a corresponding address is present in the high-speed nonvolatile memory 320 of the second circuit 300.

In other words, data of the high-speed nonvolatile memory 320 is transferred from the serial data port by the high-speed data transfer control circuit 310.

Even if the second circuit board 30 mounting the second circuit 300 therein is taken out of a device, electric power is supplied to the second circuit 300 by the built-in battery 50.

Therefore, in the high-speed data transfer control circuit 310 of the second circuit 300, write data to the nonvolatile memory 210 of the first circuit 200 stored in the high-speed nonvolatile memory 320 is continuously transferred.

Thus, in the high-speed data transfer control circuit 310, data of the high-speed nonvolatile memory 320 is continuously transferred to the nonvolatile memory 210 of the first circuit 200. Then, when no data to be written to the nonvolatile memory 210 of the first circuit 200 is present in the high-speed nonvolatile memory 320 of the second circuit 300, transfer is completed.

In the case where data to be written to the nonvolatile memory 210 of the first circuit 200 is present in the high-speed nonvolatile memory 320 of the second circuit 300, a user is informed that data is being transferred by flowing a current to an LED as a transfer display from the high-speed data transfer control circuit 310.

When the display is on, the user is allowed to confirm that all data to be stored in the first circuit 200 is stored by not removing the first circuit 200 from the second circuit 300.

<2. Fuse Control>

Next, fuse control will be described below.

Figure 2:
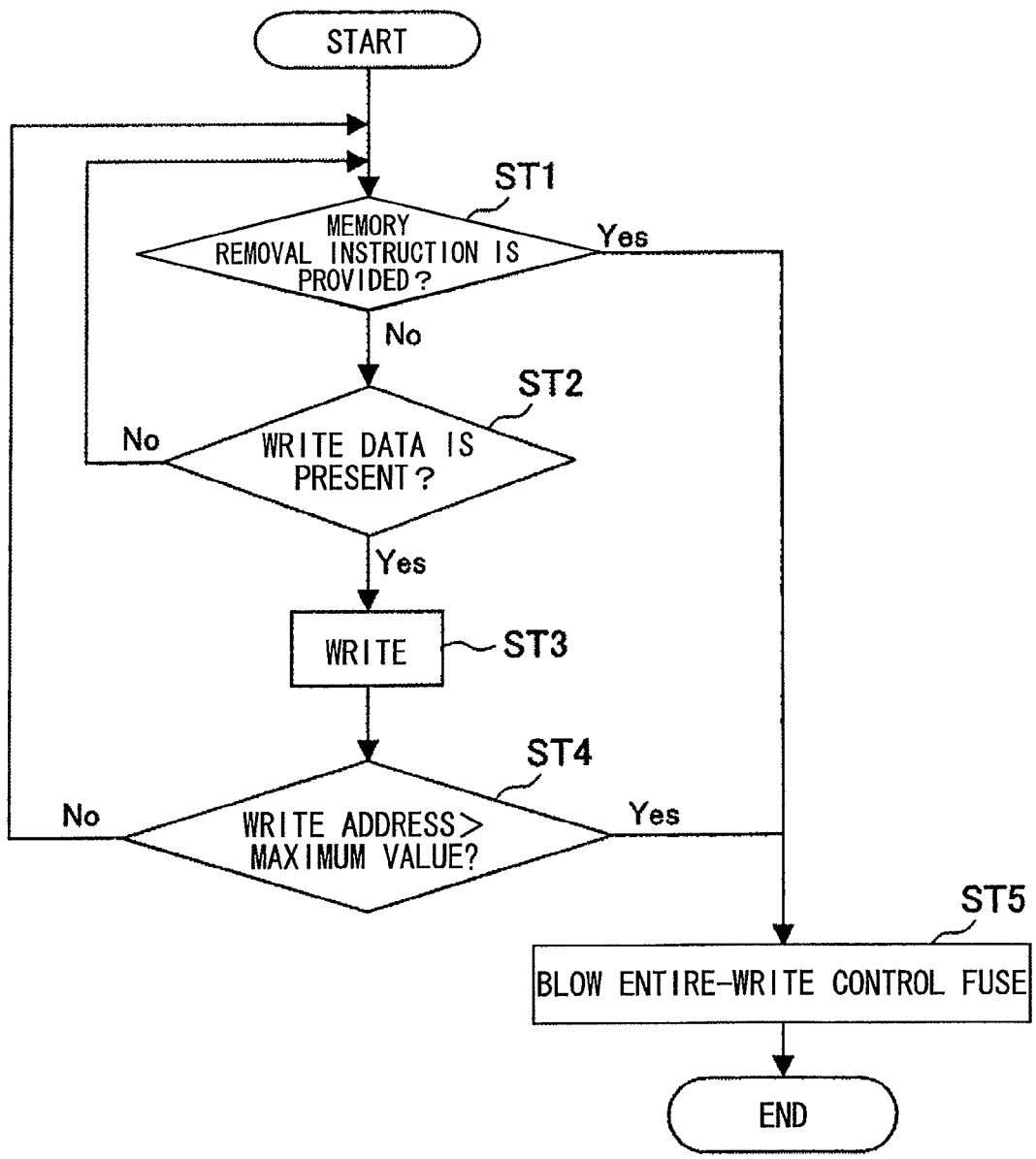
FIG. 2 is a flow chart illustrating an example of fuse control according to the embodiment.

FIG. 2 is a flow chart illustrating an example of fuse control according to the embodiment.

Steps of burning an entire-write control fuse inhibiting data writing to the nonvolatile memory 210 will be described referring to FIG. 2.

The write address may start from any address, and may count up or down; however, herein, an example of counting up from a write address of zero is illustrated.

The high-speed write/read control circuit 230 determines whether a memory removal instruction is provided (ST1).

In the step ST1, it is determined that the memory removal instruction is not provided, it is determined by a write request to the nonvolatile memory 210 of the first circuit 200 whether nonvolatile-memory write data of the first circuit 200 is present (ST2).

In the step ST2, in the case where it is determined that the nonvolatile-memory write data of the first circuit 200 is present, data writing to the nonvolatile memory 210 of the first circuit 200 is performed through the first path PT1 of the selector (ST3).

Next, it is determined whether the write address exceeds a predetermined maximum value such as a maximum address of the nonvolatile memory 210 of the first circuit 200 (ST4).

In the step ST4, in the case where it is determined that the write address exceeds the predetermined maximum value, the write inhibition signal S230 is emitted to blow the fuse of the entire-write control fuse circuit 220. Therefore, the fuse is burnt, and the R/W line LRW4 is fixed to the high level, thereby completing writing to the nonvolatile memory 210 of the first circuit 200 (ST5).

In the case where the write address does not exceed the maximum value, writing is still possible; however, in the case where a memory removal instruction or the like is provided, the write inhibition signal S230 is emitted to blow an entire-write control fuse. Therefore, the fuse is burnt, and the R/W line LRW4 is fixed to the high level, thereby completing writing to the nonvolatile memory 210 of the first circuit 200.

[Configuration Examples of High-Speed Write/Read Control Circuit and Entire-Write Control Fuse Circuit]

Figure 3:
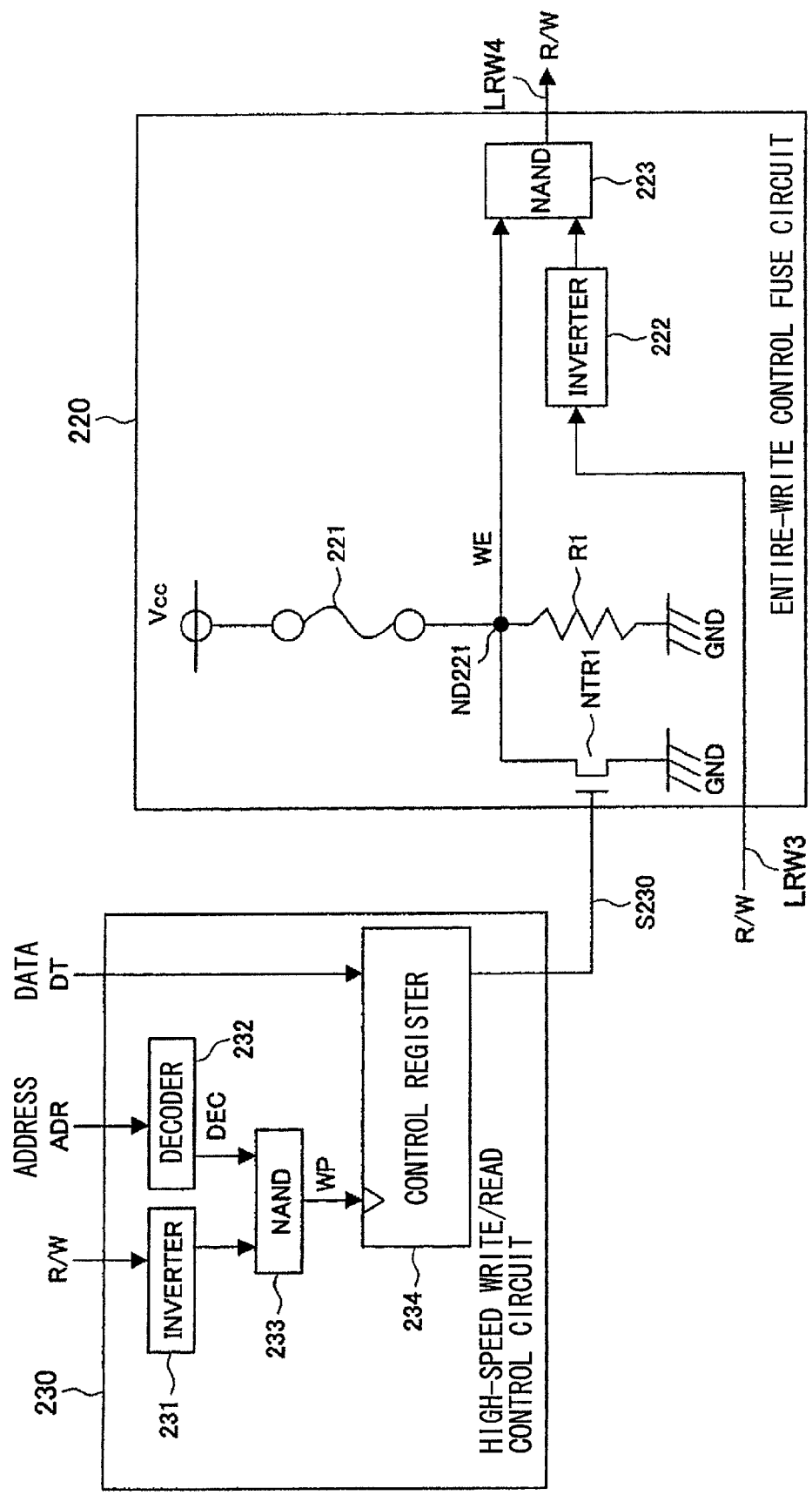
FIG. 3 is a circuit diagram illustrating configuration examples of a high-speed write/read control circuit and an entire-write control fuse circuit according to the embodiment.

FIG. 3 is a circuit diagram illustrating configuration examples of the high-speed write/read control circuit and the entire-write control fuse circuit according to the embodiment.

Hereinafter, a method of blowing a fuse of the entire-write control fuse circuit 220 for entire-write control controlled in the high-speed write/read control circuit 230 will be described referring to FIG. 3.

The entire-write control fuse circuit 220 in FIG. 3 includes a fuse 221, an inverter 222, an NAND circuit 223, an n-channel MOS (NMOS) transistor NTR1, a resistive element R1 and a node ND221.

The high-speed write/read control circuit 230 in FIG. 3 includes an inverter 231, a decoder 232, an NAND circuit 233 and a control register 234.

In the entire-write control fuse circuit 220, the fuse 221 is connected between a power supply node Vcc and the node ND221.

The NMOS transistor NTR1 and the resistive element R1 are connected in parallel between the node ND221 and a ground GND. A gate of the NMOS transistor NTR1 is connected to an output line for the write inhibition signal 5230 of the high-speed write/read control circuit 230.

In the NAND circuit 223, a write control signal WE which is present in the node ND221 is supplied to a first input, and an R/W signal is supplied to a second input through the inverter 222.

In the high-speed write/read control circuit 230, the address ADR is decoded by the decoder 232. Then, a write pulse WP is emitted only in the case of a predetermined address such as a maximum address of the nonvolatile memory 210 of the first circuit 200 as a specific address value, and the value of data at this time is allowed to be recorded in the control register 234.

When "1" is written to the control register 234 by this function, the write inhibition signal 5230 is changed to the high level, thereby allowing the NMOS transistor NTR1 in the entire-write control fuse circuit 220 to be turned on.

At the time of production of a chip, the resistance of the fuse 221 is several hundreds of ohms, the resistance of a pull-down resistive element R1 is several hundreds of ohms; however, when the NMOS transistor NTR1 is turned on, resistance between the node ND221 where the write control signal WE is present and a ground node becomes several tens of ohms.

Therefore, a large current flows between the power supply node Vcc and the node ND221 where the write control signal WE is present to blow the fuse 221.

When the fuse 221 is blown, the resistance of the fuse 221 becomes infinite; therefore, the write control signal WE is turned to the low level which is a ground potential by the pull-down resistive element R1.

The R/W signal is supplied to the NAND circuit 223 through the inverter 222. As the write control signal WE which is the other input of the NAND circuit 223 stays at the low level, an output of the NAND circuit 223 is not allowed to be turned to the low level, and is continuously maintained at the high level, and writing is not allowed to be performed accordingly.

<3. Control by Write Pointer>

Figure 4:
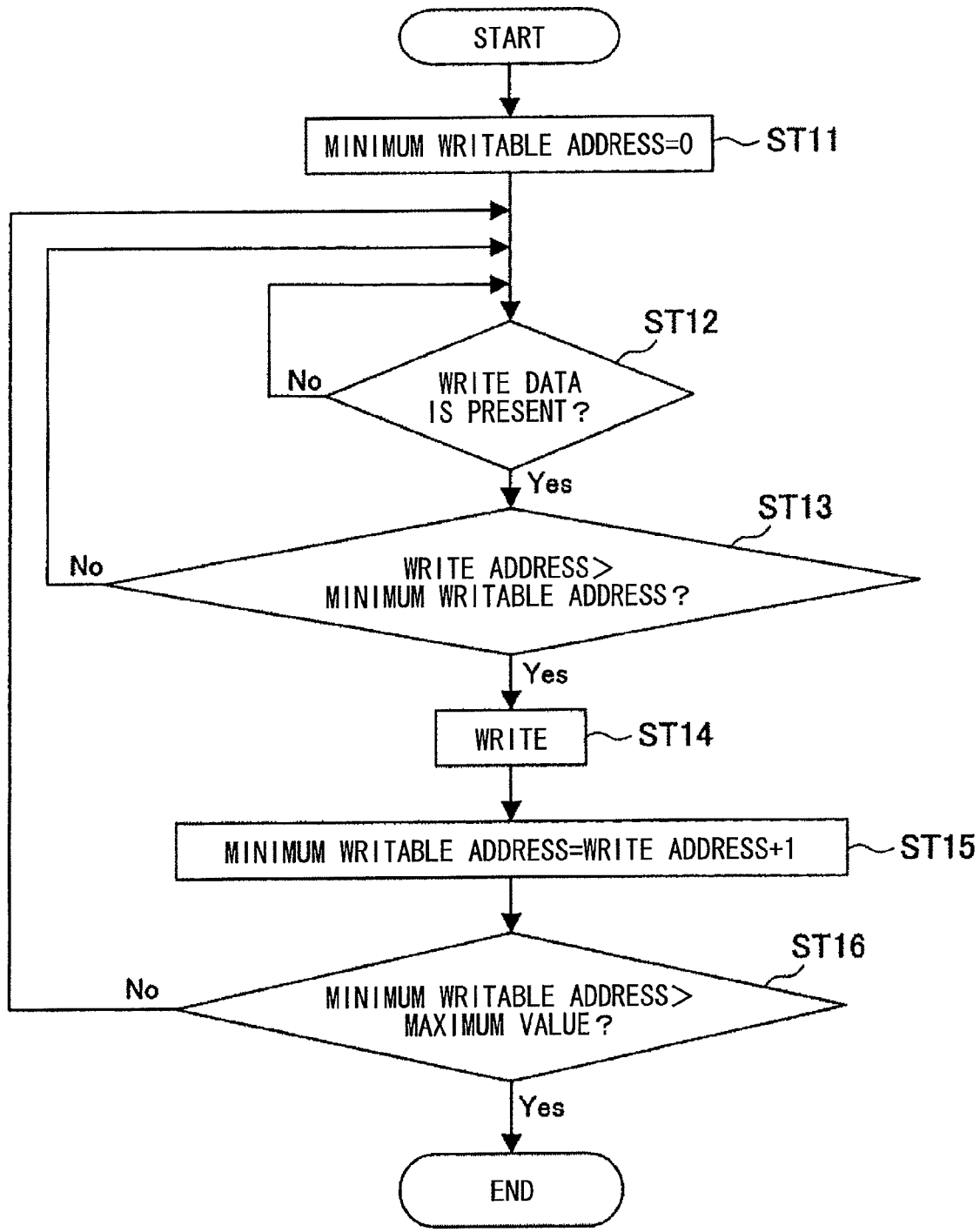
FIG. 4 is a flow chart illustrating a control process procedure by a write pointer of an area-unit write control circuit according to the embodiment.

FIG. 4 is a flow chart illustrating a control process procedure by a write pointer of the area-unit write control circuit according to the embodiment.

Next, a procedure of the area-unit write control circuit 260 using control by the write pointer will be described referring to FIG. 4.

In this case, the write address may start from any address, the write address may count up or down, or an arbitrary address may be provided.

The purpose of a process of the area-unit write control circuit 260 is to inhibit writing to a lower-order address than a written address in the case where data is stored under a count-up mode.

Hereinafter, an example of counting up from a write address of zero will be described.

The area-unit write control circuit 260 stores a minimum writable address in the nonvolatile register 270 in the first circuit 200, and the minimum writeable address which is allowed to be written is set to zero as an initial state (ST11).

Next, the area-unit write control circuit 260 determines whether nonvolatile-memory write data of the first circuit 200 is present by a write request to the nonvolatile memory 210 of the first circuit 200 (ST12).

In the step ST12, in the case where it is determined that the write data is present, the area-unit write control circuit 260 determines whether the write address is smaller than the minimum writable address (ST13).

In the step ST13, in the case where it is determined that the write address is smaller than the minimum writable address, data is written to the nonvolatile memory 210 of the first circuit 200 by the high-speed write/read control circuit 230 (ST14).

Then, the area-unit write control circuit 260 adds a write address of 1 to the minimum writable address to obtain a new minimum writable address (ST15).

Next, the area-unit write control circuit 260 determines whether the minimum writable address exceeds a predetermined maximum value such as a maximum address of the nonvolatile memory 210 of the first circuit 200 (ST16).

Then, in the step ST16, in the case where it is determined that the minimum writable address does not exceed the maximum value, the process from the step ST12 is repeated, and in the case where it is determined that the minimum writable address exceeds the maximum value, the process is completed.

<4. Process of Continuing Transfer>

Figure 5B:
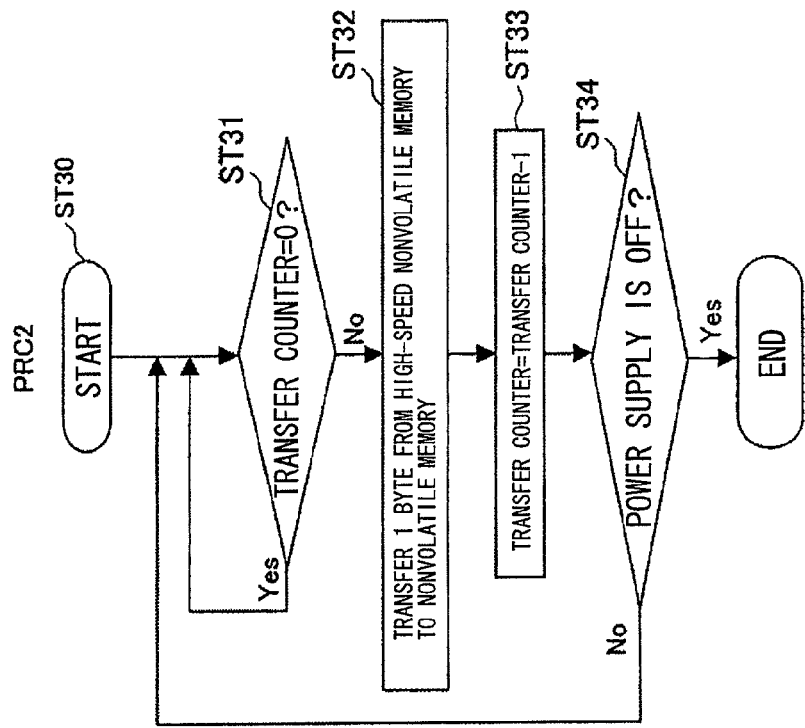
FIG. 5 is a flow chart for describing a process of continuing transfer by a high-speed data transfer control circuit according to the embodiment.
Figure 5A:
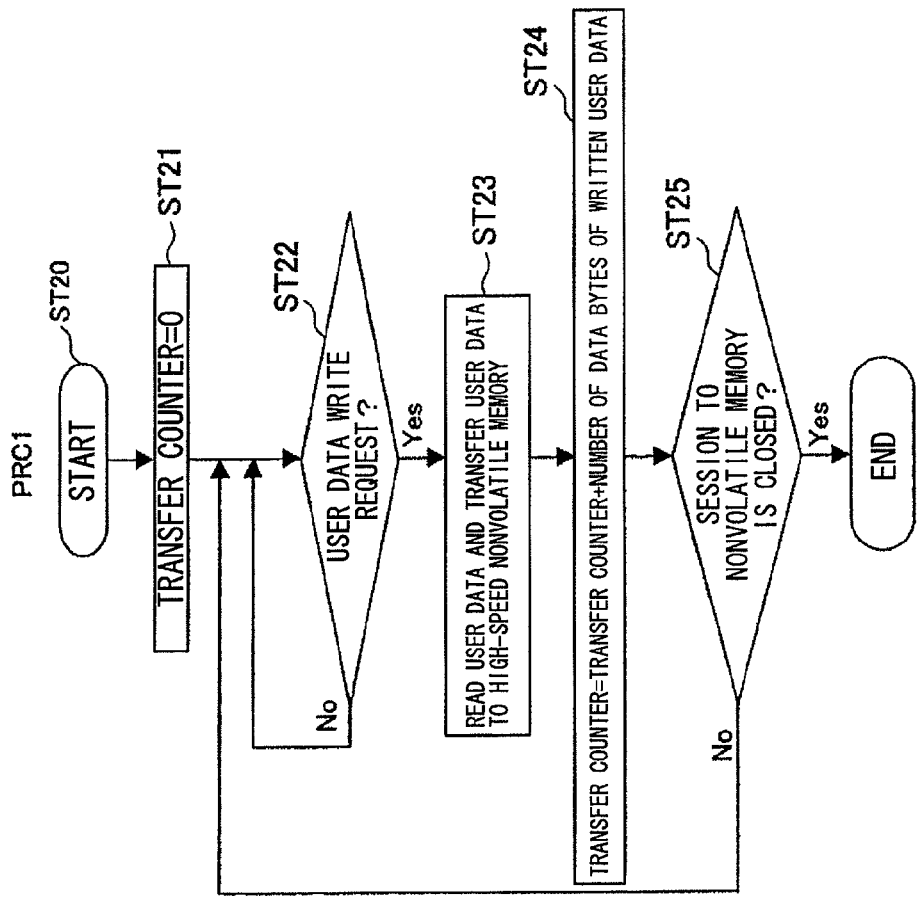

FIGS. 5(A) and (B) illustrate flow charts for describing a process of continuing transfer by the high-speed data transfer control circuit according to the embodiment.

A process of temporarily storing user data in the high-speed nonvolatile memory of the second circuit 300 and sequentially writing the user data to the nonvolatile memory of the first circuit 200 will be described referring to FIGS. 5(A) and (B).

This process is divided into two processes PRC1 and PRC2, and the two processes PRC1 and PRC2 are separately executed.

The process PRC1 includes processes of steps ST20 to ST25, and the process PRC2 includes processes of steps ST30 to ST34.

The process PRC1 starts upon starting of a write session on the nonvolatile memory 210 and terminates when the write session on the nonvolatile memory is closed (ST20 to ST25).

This session indicates a period from the start of data writing to a one-time memory to the completion of the writing.

The high-speed data transfer control circuit 310 sets a transfer counter to zero in the step ST21.

Next, the high-speed data transfer control circuit 301 determines whether a user data write request is made (ST22).

In the step ST22, when the user data write request is made, the high-speed data transfer control circuit 301 reads the user data and transfers the data as it is to the high-speed nonvolatile memory 320 in response to the request (ST23).

The number of data bytes of written user data is added to the transfer counter to renew the value of the transfer counter (ST24).

When the write session to the nonvolatile memory 210 is not closed, the user data write request is waited, and the same flow is performed. When a session close request is made, the write session is completed (ST25).

In the process PRC2, when the power supply is turned on, this process starts (ST30).

The number of data bytes transferred to the high-speed nonvolatile memory 320 in the process PRC1 is sequentially added to the transfer counter. The value of the transfer counter is confirmed (ST31), and when the value is not zero, 1 byte is transferred from the high-speed nonvolatile memory 320 to the nonvolatile memory 210 (ST32).

This transfer may be performed in units of one byte or a plurality of bytes; however, in this case, the count-up value of the transfer counter is equal to a transfer data amount indicating the number of bytes transferred at the same time, and in this case, as a typical example, the case where the transfer is performed in units of one byte will be described below.

When 1 is subtracted from (added to) the transfer counter, the value of the transfer counter is renewed (ST33). This process is continuously performed while the power supply is on (ST34).

Moreover, in the case where data to be transferred is present in the high-speed nonvolatile memory 320 of the second circuit 300 and power is supplied to the first circuit 200 and the second circuit 300, data is transferred from the high-speed nonvolatile memory 320 of the second circuit 300 to the nonvolatile memory 210 of the first circuit 200.

In the case where a memory unit such as a memory card mounting the first circuit 200 and the second circuit 300 therein is removed from a device, and power is not supplied, the process of the step ST32 in the process PRC2 is suspended. In other words, the data transfer from the high-speed nonvolatile memory 320 of the second circuit 300 to the nonvolatile memory 210 of the first circuit 200 is suspended.

In the case where the memory unit is mounted in the device again, and power by the power supply is supplied to the first circuit 200 and the second circuit 300, the next process is performed in the process PRC2.

In other words, in the process PRC2, data transfer from the high-speed nonvolatile memory 320 of the second circuit 300 to the nonvolatile memory 210 of the first circuit 200 is continued referring to the transfer counter value recorded in the nonvolatile memory.

In the case where a battery for backup is mounted in the first circuit 200 and the second circuit 300 and power is continuously supplied to the first circuit 200 and the second circuit 300 in spite of removing the memory unit from the device, transfer is continued without interruption.

<5. Design Based on a Plurality of Design Criteria>

FIGS. 6(A) and (B) are diagrams conceptually illustrating an example of designing circuits according to a plurality of service lives in one and the same chip designed based on a plurality of design criteria.

Next, an example of designing circuit according to a plurality of service lives in one and the same chip with use of design based on a plurality of design criteria will be described below referring to FIGS. 6(A) and (B).

FIGS. 6(A) and 6(B) illustrate an example with 100-year design reliability and an example with 10-year design reliability, respectively.

Moreover, FIG. 6(A-1) and FIG. 6(B-1) are plan views and FIG. 6(A-2) and FIG. 6(B-2) are schematic sectional views.

A circuit with a 100-year warranty is designed to have a margin for performance deterioration in a semiconductor or the like in expectation of characteristics for long-term use such as 100-year use.

Moreover, in consideration of corrosion resistance, for example, polysilicon is used for a gate material of a MOS transistor, and a size allowing a transistor size and a line width of wiring to have a 100-year warranty is designed.

Referring to an example using a p-channel MOS (PMOS) transistor PT1A, P-regions are formed in an N well 101A as a source region 102A and a drain region 103A, and an oxide film 104A is sandwiched therebetween to form a polysilicon gate 105A.

A circuit with 10-year design reliability is designed to have a design margin under a 10-year warranty on characteristics in typical design of a semiconductor or the like. For example, a metal such as TiN is used for a gate material of a MOS transistor, and a size allowing a transistor size and a line width of wiring to have a 100-year warranty is designed.

Also in this case, referring to an example using a PMOS transistor PT1B, P-regions are formed in an N well 101B as a source region 102B and a drain region 103B, and an oxide film 104B is sandwiched therebetween to form a metal gate 105B.

<6. Recording of Chip Identification Data>

Figure 7:
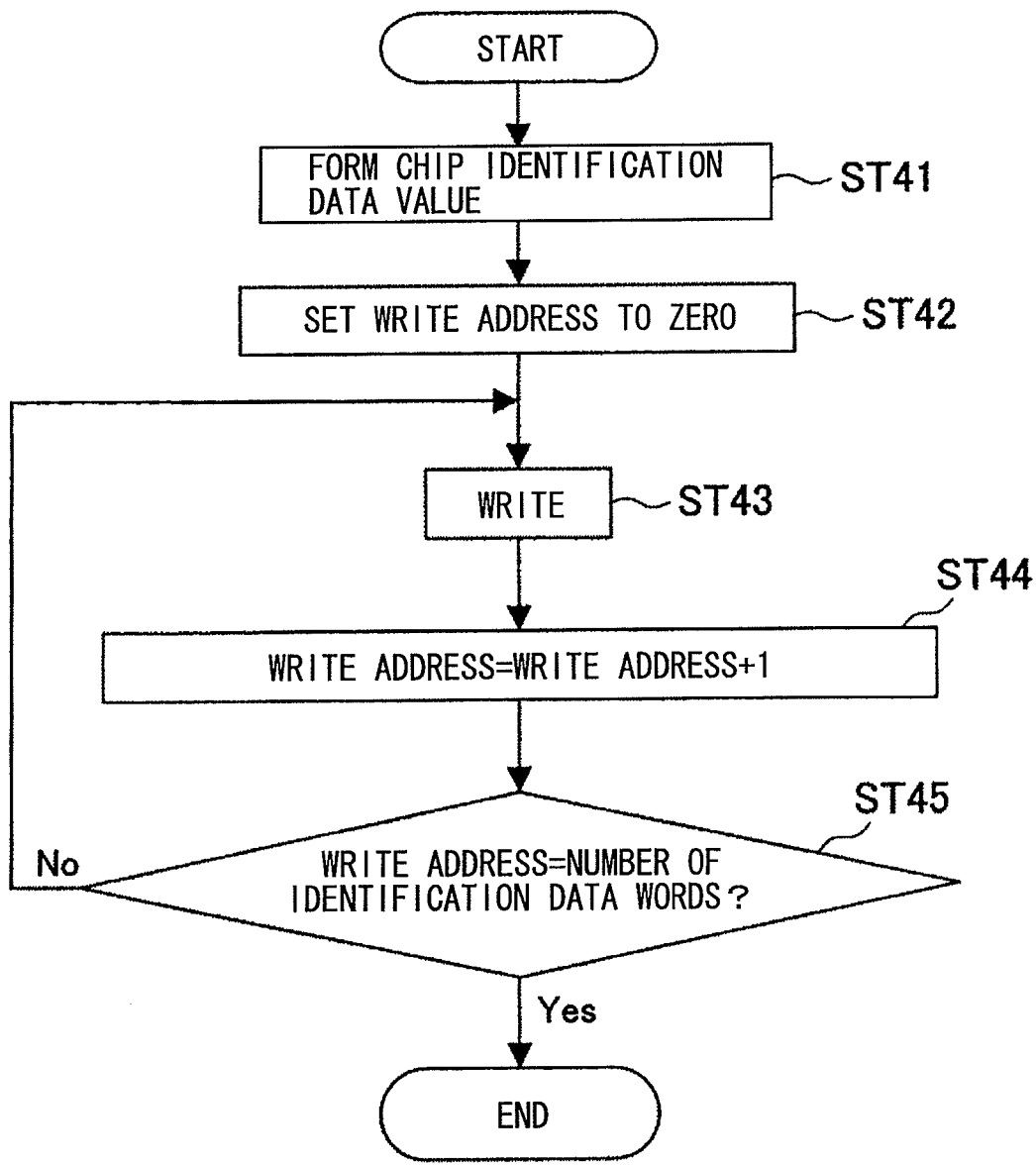
FIG. 7 is a flow chart illustrating an example of a procedure of recording chip identification data according to the embodiment.

FIG. 7 is a flow chart illustrating an example of a procedure of recording chip identification data according to the embodiment.

Next, referring to FIG. 7, the procedure of recording identification data for identifying a chip will be described below.

As chip identification data, chip identification data including unique values for respective chips, and the like is formed (ST41).

Next, the write address to be written to the nonvolatile memory 210 of the first circuit 200 is set to zero (ST42), and writing is executed on an address of zero in the nonvolatile memory 210 of the first circuit 200 (ST43).

Next, a value obtained by adding 1 to the write address value is set as a new write address value (ST44).

When the new write address value becomes equal to the number of words of identification data used for identification, the process is completed, and when the write address value is not equal to the number of words of identification data, writing is continued (ST45).

<7. Serial Communication Format>

Figure 8:
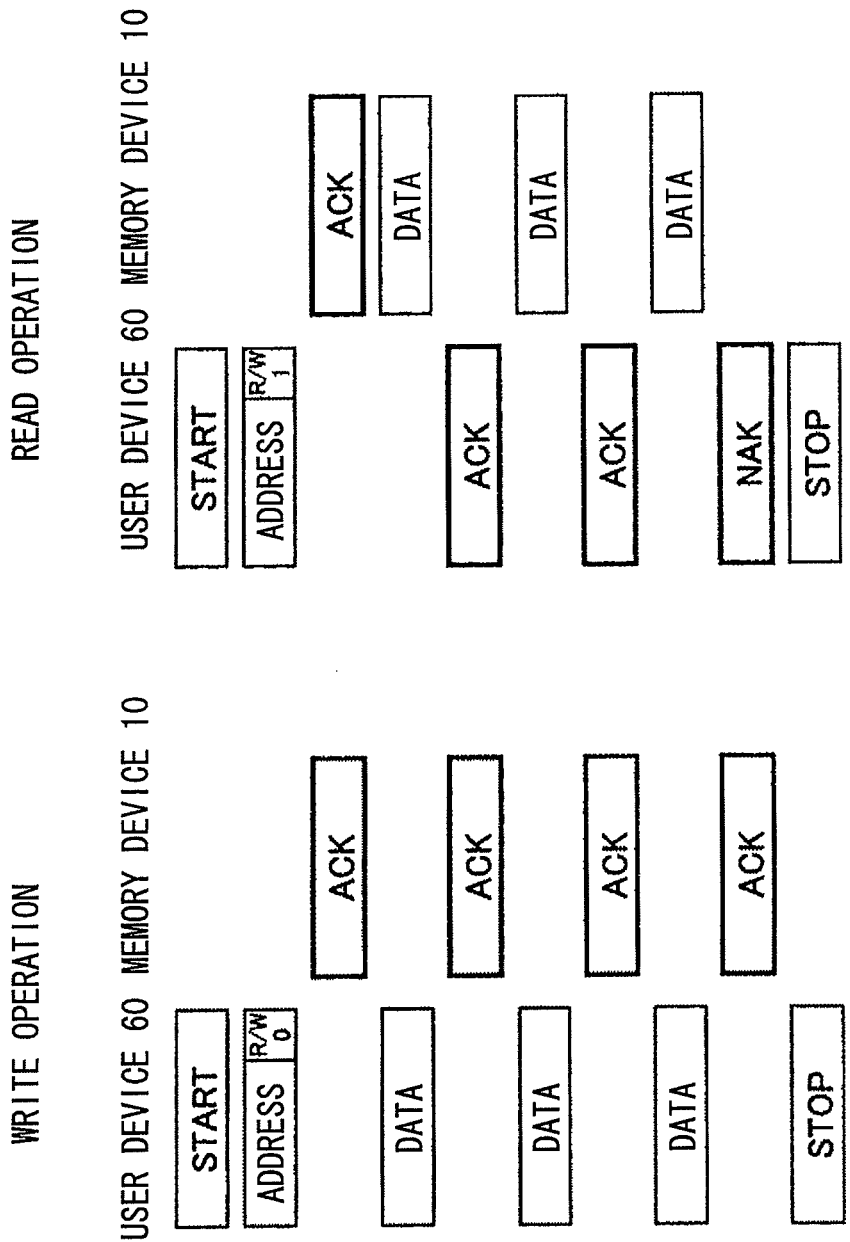
FIG. 8 is a diagram for describing format examples of serial communication of the high-speed data transfer control circuit according to the embodiment.

FIGS. 8(A) and (B) are diagrams for describing format examples of serial communication of the high-speed data transfer control circuit according to the embodiment. FIG. 8(A) illustrates a format in a write operation and FIG. 8(B) illustrates a format example in a read operation.

Next, referring to FIGS. 8(A) and (B), formats of serial communication of the high-speed data transfer control circuit 310 of the second circuit 300 will be described below.

Although high-speed transfer in a burst transfer mode or the like is allowed to be performed, only relatively small data transfer will be described herein. In this case, word is a unit of transfer, and may be byte data of 8 bits or two-byte data of 16 bits. Only data may include a plurality of bytes and other words except for data may include one byte.

As illustrated in FIG. 8(A), in writing from a user device 60 to the memory device 10, after a START word indicating the start of data transfer from the user device 60 to the memory device 10 is transferred, a stored address of data with an R/W bit set to zero is sequentially transferred.

In the case where the address is successfully received by the memory device 10, an ACK word is sent back from the memory to the user device 60.

In the case where data to be sent is present in the user device 60, the user device 60 further transfers a data word, and in the case where the data word is received by the memory device 10 successfully, the ACK word is sent back from the memory device 10 to the user device 60.

In the case where data to be sent is not present in the user device 60, a STOP word is transferred from the user device 60 to the memory device 10 to complete a whole write operation.

As illustrated in FIG. 8(B), in the case where the user device 60 reads data from the memory device 10, after a START word indicating the start of data transfer from the user device 60 to the memory device 10 is transferred, a read address of data with the R/W bit set to 1 is transferred.

In the case where data is received by the memory device 10 successfully, the ACK word is sent back from the memory device 10 to the user device 60.

In the case where data of an appointed read address is transferred to the user device 60 to be received by the user device 60 successfully, the ACK word is sent back from the user device 60 to the memory device 10.

In the case where data to be received is not present in the user device 60, an NAK word is transferred from the user device 60 to the memory device 10, and then a STOP word is transferred to complete a whole read operation.

<8. Breakdown Avoidance by a Plurality of Modules>

Figure 9:
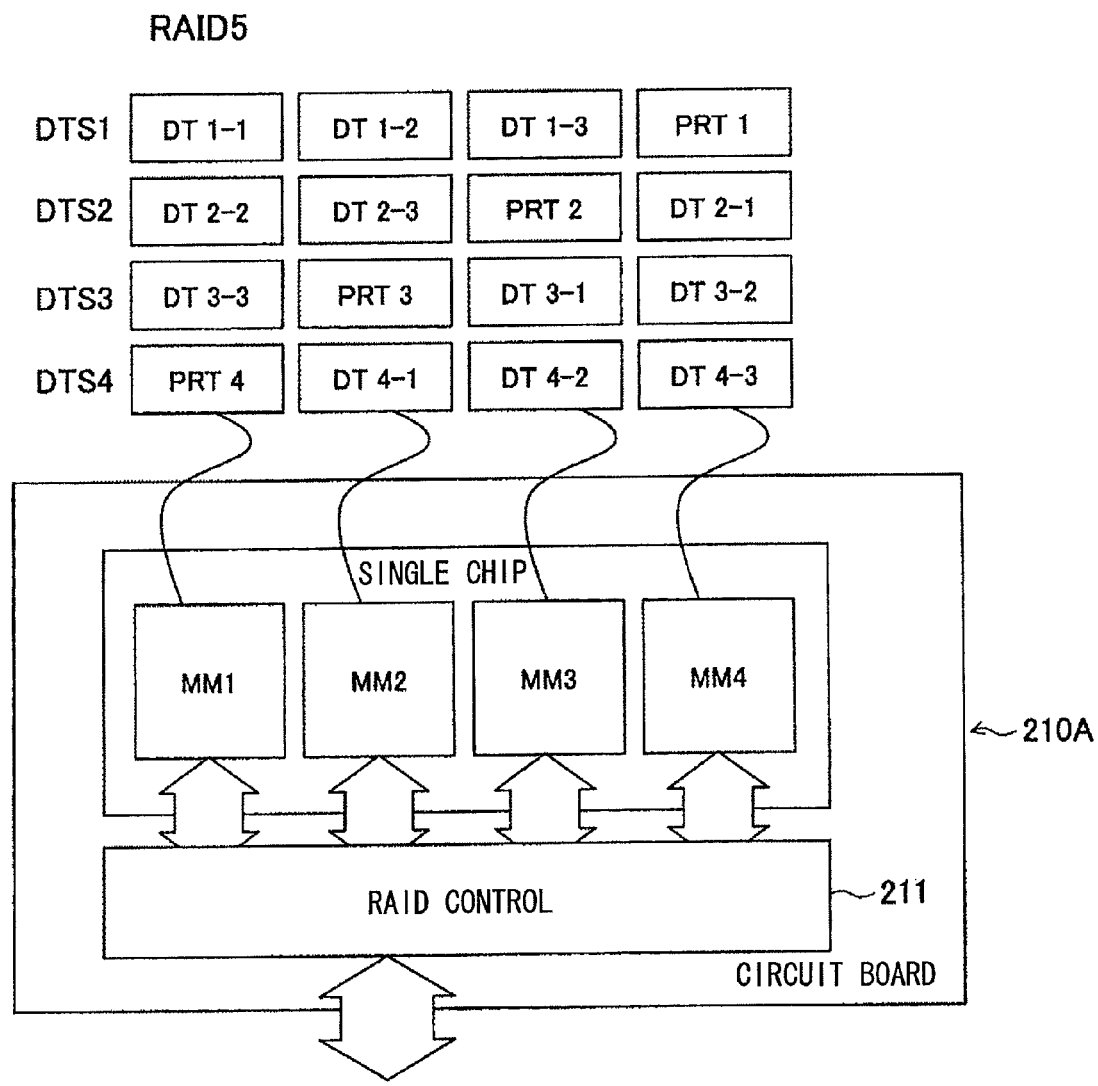
FIG. 9 is a diagram illustrating a configuration example of avoiding a breakdown by a plurality of modules.

FIG. 9 is a diagram illustrating a configuration example of avoiding a breakdown by a plurality of modules.

Next, referring to FIG. 9, a mechanism capable of restoring all data by mounting a plurality of modules in the nonvolatile memory 210A of the first circuit 200 even in the case where data is not allowed to be read due to a critical issue occurring in one of the modules will be described below.

In the case where a specific bit or the like is not allowed to be read in a process in each module, a single bit in a word in data of each memory module is allowed to be restored by an ECC; however, when the whole module suffers a breakdown, data is not allowed to be restored by the ECC for each module.

A plurality of memory modules MM having the same input/output interface are mounted in one memory chip, and data is stored in the plurality of modules in a RAID configuration.

In FIG. 9, MM1 to MM4 each indicate a memory module, and a reference numeral 211 indicates a RAID control section.

A circuit storing data in a RAID configuration is arranged outside the memory chip.

Data corresponding to replacement of the memory modules MM1 to MM4 with hard drives of a hard disk is stored.

Generally used terms for hard disk include RAID5 (block-level striping with distributed parity) and the like, and data corresponding thereto is stored.

The functions of the RAID control section 211 are the same as those performed in such a hard disk, and will not be described herein.

For example, a data storing method in the case of RAID5 will be described below.

Data DT1-1, data DT1-1, data DT1-1 and a parity PRT1 are considered as a data series DTS1, and data DT2-1, data DT2-1, data DT2-1 and a parity PRT2 are considered as a data series STS2.

Likewise, data DT3-1, data DT3-1, data DT3-1 and a parity PRT3 are considered as a data series DTS3 and data DT4-1, data DT4-1, data DT4-1 and a parity PRT4 are considered as a data series DTS4.

The data DT1-1 or the like is called a data block, data forming a series is divided into blocks with the same size, and a block storing a parity of data corresponding to the same relative address in a block is a parity block of the series, and in the case of the data series DTS1, the parity block thereof is the parity PRT1.

Blocks of each data series are stored in the memory modules MM1, MM2, MM3 and MM4 in the single chip, respectively.

The data DT1-1, the data DT2-2, the data DT3-3 and the parity PRT4 are stored in the memory module MM1.

The data DT1-2, the data DT2-3, the data DT4-1 and the parity PRT3 are stored in the memory module MM2.

The data DT1-3, the data DT3-1, the data DT4-2 and the parity PRT2 are stored in the memory module MM3.

The data DT2-1, the data DT3-2, the data DT4-3 and the parity PRT1 are stored in the memory module MM4.

When data and parities corresponding thereto are separately stored in the modules, the following effects are obtainable.

Namely, even if any of the memory modules suffers a breakdown, and all data is not allowed to be read from the module, all data stored in the memory module where information is not read due to the breakdown is allowed to be restored with use of information in other memory modules.

<9. Analysis with Mark Figure>

Figure 10:
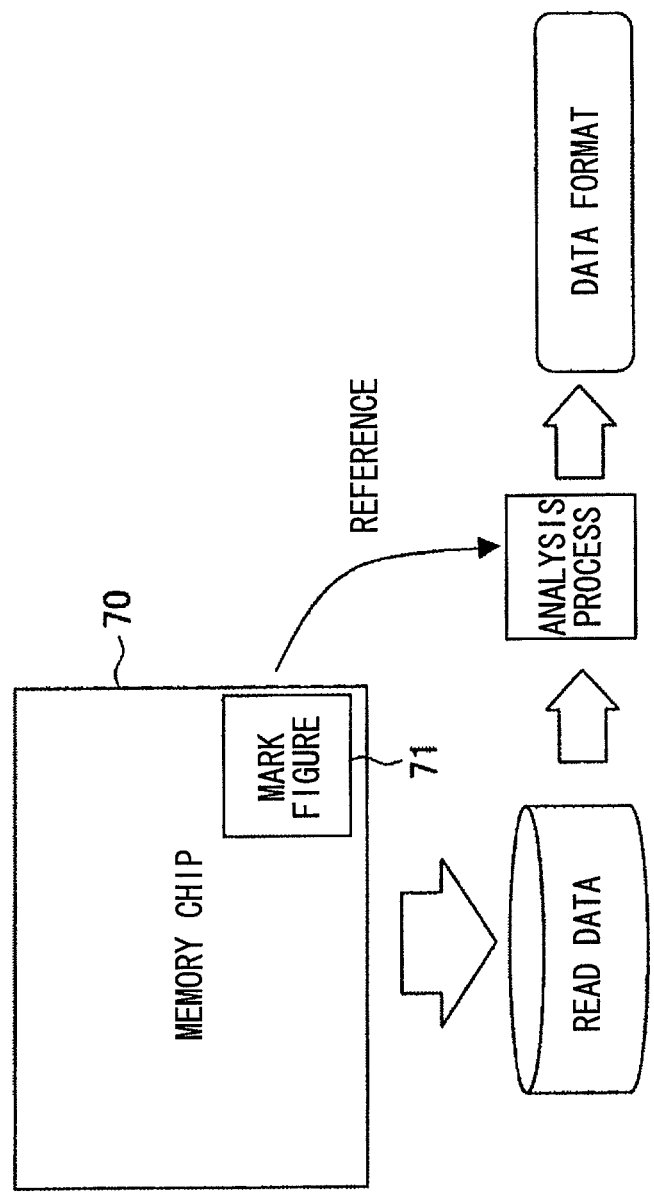
FIG. 10 is a diagram for describing an example of analyzing a format of data stored in a memory with a mark figure according to the embodiment.

FIG. 10 is a diagram for describing an example of analyzing a format of data stored in a memory with a mark figure according to the embodiment.

Next, a state where analysis of a data format stored in a memory chip with a smaller number of steps is accurately performed by storing a specific mark as data to allow analysis of a format of data stored in a memory and inscribing the specific mark on a chip surface or the like will be described below.

A figure is formed of, for example, polysilicon on a surface of a memory chip 70, thereby allowing a specific shape to be recognized as a mark FIG. 71. The memory chip 70 herein corresponds to the first circuit 200 in FIG. 1.

The chip surface is allowed to be optically observed, and a protective film of silicon oxide or the like may be included in an uppermost surface of a chip.

Image data of the same figure is included in data stored in the nonvolatile memory of the memory chip 70.

In the case where as a long time has passed since data is stored in the memory, the format of the stored data becomes unknown, the following process is performed.

An aim is to allow the figure on the chip surface to be restored from read data in an analysis process while trying a plurality of algorithms of data analysis.

In the case where a completely different figure start to be formed during the analysis, the analysis with a present algorithm or parameter is suspended, and analysis is continued with a next parameter or algorithm; therefore, an analysis operation is allowed to be efficiently performed, and certainty of the analysis result is allowed to be confirmed.

As described above, in the embodiment, the following effects are achievable.

Cost per bit of the memory chip is allowed to be minimized.

Variations of interface specifications necessary for the memory chip are allowed to be limited to a very small number of kinds or only one type.

As the interface specifications of the memory chip are allowed to be simplified, an issue that data is not allowed to be read due to unknown interface specifications is prevented.

Moreover, important data written to the memory is prevented from being rewritten or erased by a virus, a human error, a process system bug, or the like.

Long-term storage stability as one-time writing is allowed to be secured.

As data of the memory is not at all changed, impossibility of falsification is allowed to be secured.

A memory with low operation speed due to long-term storage stability is allowed to be used at high speed like a typical flash memory.

Data is allowed to be reliably stored in a long-term storage memory.

Moreover, design based on realistic design criteria is possible.

As a corrosion-resistance material is used, a long-term warranty of reading close to memory cell retention characteristics is allowed.

Then, recorded data is allowed to be stably stored over a long term of several decades or longer, and the stored data is allowed to be read reliably.

The invention claimed is:

1. A memory device comprising:
   a first circuit configured to perform data recording for storing; and
   a second circuit configured to perform data transfer control to allow the first circuit to perform data recording and data reproduction,
   wherein the first circuit and the second circuit are separately implementable, and
   wherein the first circuit includes:
      a data recording circuit configured to read recorded data from an address appointed by an address signal when a read/write signal stays at a first level, and configured to write data to the address appointed by the address signal when the read/write signal stays at a second level;
      a write/read control circuit configured to perform data write/read control on the data recording circuit according to the address signal in response to a read or write instruction from the second circuit; and
      a read control circuit configured to transfer data read from the data recording circuit to the second circuit through a first path different from a second path through which the write/read control circuit is configured to transfer data.

2. The memory device according to claim 1, wherein:
   the second circuit includes a high-speed data transfer control circuit and a connector connected thereto, and
   the first circuit further includes a connection section configured to be removably connected to the connector.

3. The memory device according to claim 1, wherein the write/read control circuit and the read control circuit are connected to the second circuit through respective paths different from each other.

4. The memory device according to claim 3, wherein once the data recording circuit is inhibited from data-writing, the first path used for reading data by the read control circuit is selected.

5. The memory device according to claim 3, wherein the second circuit includes:
   a data transfer control circuit configured to perform data transfer control between the first and second circuits; and
   a work memory for the data transfer control circuit, the data transfer control circuit being connected to the write/read control circuit and the read control circuit through respective paths different from each other.

6. The memory device according to claim 3, wherein the first circuit further includes:
   a write control circuit configured to supply the read/write signal of the first or second level to the data recording circuit when a write inhibition signal is inactive, and configured to fix the read/write signal to the first level to inhibit the data recording circuit from data-writing and to output a selection signal when the write inhibition signal of active state is supplied; and
   a selector configured to select the first path when the data recording circuit is not inhibited from data-writing, and configured to select the second path when the data recording circuit is inhibited from data-writing, the first path allowing data writing to or data reading from the data recording circuit through the write/read control circuit, the second path allowing data reading from the data recording circuit through the read control circuit, and
   wherein the write/read control circuit is configured to perform data write/read control on the data recording circuit according to the address signal in response to a read or write instruction from the second circuit, and is configured to supply the write inhibition signal of active state to the write control circuit in response to an occurrence of a predetermined event.

7. A memory device comprising:
   a first circuit configured to perform data recording for storing; and
   a second circuit configured to perform data transfer control to allow the first circuit to perform data recording and data reproduction,
   wherein the first circuit and the second circuit are separately implementable, and
   wherein the first circuit includes:
      a data recording circuit configured to read recorded data from an address appointed by an address signal when a read/write signal stays at a first level, and configured to write data to the address appointed by the address signal when the read/write signal stays at a second level;
      a write/read control circuit configured to perform data write/read control on the data recording circuit according to the address signal in response to a read or write instruction from the second circuit, and configured to perform control to set the read/write signal to the data recording circuit to the first level in response to an occurrence of a predetermined event, thereby inhibiting the data recording circuit from data-writing; and
      a read control circuit configured to transfer data read from the data recording circuit to the second circuit through a first path different from a second path through which the write/read control circuit is configured to transfer data.

8. The memory device according to claim 7, wherein the predetermined event causing a transition to write inhibition control includes a case where data-writing to the data recording circuit starts from a start address, and reaches a predetermined address.

9. The memory device according to claim 7, wherein the predetermined event causing a transition to write inhibition control includes a case where removal of the first circuit is instructed.

10. The memory device according to claim 7, wherein the predetermined event causing a transition to write inhibition control includes a case where a write address reaches a lower-order or higher-order address than a written address during a data storage operation under address count-up mode or address count-down mode.

11. The memory device according to claim 7, further comprising a write control circuit configured to supply the read/write signal of the given first or second level to the data recording circuit when a write inhibition signal is inactive, and configured to fix the read/write signal to the first level when the write inhibition signal of active state is supplied, wherein the write/read control circuit is configured to perform data write/read control on the data recording circuit according to the address signal in response to a read or write instruction from the second circuit, and is configured to supply the write inhibition signal of active state to the write control circuit in response to the occurrence of the predetermined event.

12. The memory device according to claim 11, wherein the write control circuit includes a fuse circuit including a fuse, the fuse circuit allowing the fuse to have high resistance in response to the write inhibition signal of active state, thereby fixing the read/write signal to the first level.

13. A memory device comprising:
a first circuit configured to perform data recording for storing; and
a second circuit configured to perform data transfer control to allow the first circuit to perform data recording and data reproduction,
wherein the first circuit and the second circuit are separately implementable,
wherein the first circuit includes:
a data recording circuit configured to read recorded data from an address appointed by an address signal when a read/write signal stays at a first level, and configured to write data to the address appointed by the address signal when the read/write signal stays at a second level; and
a write/read control circuit configured to perform data write/read control on the data recording circuit according to the address signal in response to a read or write instruction from the second circuit,
wherein the second circuit includes:
a data transfer control circuit configured to perform data transfer control between the first and second circuits; and
a work memory for the data transfer control circuit,
wherein the data transfer control circuit is configured to temporarily store, in the work memory, data to be written to the data recording circuit in the first circuit,
wherein the data transfer control circuit is configured to sequentially transfer the stored data from the work memory to the write/read control circuit in the first circuit, and
wherein the first circuit further includes a read control circuit configured to transfer data read from the data recording circuit to the second circuit through a first path different from a second path through which the write/read control circuit is configured to transfer data.

14. The memory device according to claim 13, wherein in a case where a piece of data, corresponding to data stored at a read access address in the data recording circuit in the first circuit, is present in the work memory, the data transfer control circuit transfers the piece of data in the work memory, to a connected device.

15. The memory device according to claim 13, wherein the second circuit includes an informing section, and wherein in a case where a piece of data to be written to the data recording circuit in the first circuit is present in the work memory, the data transfer control circuit informs the informing section that data transfer is under execution.

16. The memory device according to claim 13, wherein the data transfer control circuit is configured to perform:
a first process allowed to start upon starting of a write session on the data recording circuit in the first circuit, and to terminate when a write session on a nonvolatile memory is closed; and
a second process allowed to start upon turning-on of power.

17. The memory device according to claim 16, wherein the data transfer control circuit includes a transfer counter, and wherein the data transfer control circuit, in response to a data write request, reads data and transfers the read data, as it is, to the work memory, and then increments or decrements the transfer counter by the number of data bytes of read data, thereby to renew a value of the transfer counter, and wherein the data transfer control circuit waits for the data write request until the write session on the data recording circuit is closed, and terminates the first process in response to a session close request.

18. The memory device according to claim 17, wherein the data transfer control circuit is configured to start the second process upon turning-on of power, and is configured to continuously perform the second process during a power-on period, the second process including:
checking the value of the transfer counter;
transferring data from the work memory to the data recording circuit in the first circuit by an amount of data corresponding to variance of the value in the transfer counter, unless the value of the transfer counter is zero; and
incrementing or decrementing the transfer counter to renew the value of the transfer counter.

19. A memory device comprising:
a first circuit configured to perform data recording for storing; and
a second circuit configured to perform data transfer control to allow the first circuit to perform data recording and data reproduction,
wherein the first circuit includes:
a data recording circuit configured to read recorded data from an address appointed by an address signal when a read/write signal stays at a first level, and configured to write data to the address appointed by the address signal when the read/write signal stays at a second level;
a write/read control circuit configured to perform data write/read control on the data recording circuit according to the address signal in response to a read or write instruction from the second circuit, and configured to perform control to set the read/write signal to the data recording circuit to the first level in response to an occurrence of a predetermined event, thereby inhibiting the data recording circuit from data-writing;
a long-reliability read control circuit configured to transfer read data from the data recording circuit to the second circuit, when the data recording circuit is inhibited from data-writing; and
a selector configured to select a first path when the data recording circuit is not inhibited from data-writing, and configured to select a second path when the data recording circuit is inhibited from data-writing, the first path allowing data writing to or data reading from the data recording circuit through the write/read control circuit, the second path allowing data reading from the data recording circuit through the long-reliability read control circuit.

20. The memory device according to claim 19, wherein the first path for accessing the data recording circuit through the write/read control circuit and the second path for accessing the data recording circuit through the long-reliability read control circuit are configured to allow the long-reliability read control circuit and the second path to have higher reliability criteria.

21. The memory device according to claim 19, wherein the long-reliability read control circuit and the second path are configured to have a margin for performance deterioration in expectation of characteristics for long-term use, to allow the margin to be larger than that of the write/read control circuit and the first path.

22. The memory device according to claim 19, wherein the long-reliability read control circuit and the second path include a transistor and wiring, a gate electrode of the transistor and the wiring being formed of a corrosion-resistant material.

23. The memory device according to claim 22, wherein the corrosion-resistant material includes polysilicon.

24. The memory device according to claim 19, comprising a write control circuit configured to supply the read/write signal of the first or second level to the data recording circuit when a write inhibition signal is inactive, and configured to fix the read/write signal to the first level to inhibit the data recording circuit from data-writing and to output a selection signal when the write inhibition signal of active state is supplied, wherein the write/read control circuit is configured to perform data write/read control on the data recording circuit according to the address signal in response to a read or write instruction from the second circuit, and is configured to supply the write inhibition signal of active state to the write control circuit in response to the occurrence of a predetermined event, and wherein the selector is configured to select a first path when the selection signal is inactive, and is configured to select a second path when the selection signal is active, the first path allowing data writing to or data reading from the data recording circuit through the write/read control circuit, the second path allowing data reading from the data recording circuit through the long-reliability read control circuit.

25. The memory device according to claim 19, wherein the first circuit and the second circuit are separately implementable.

* * * * *